(12) United States Patent
Brodsky et al.

(10) Patent No.: US 7,709,951 B2
(45) Date of Patent: May 4, 2010

(54) THERMAL PILLOW

(75) Inventors: William L. Brodsky, Binghamton, NY (US); Peter J. Brofman, Hopewell Junction, NY (US); James A. Busby, New Paltz, NY (US); Bruce J. Chamberlin, Vestal, NY (US); Scott A. Cummings, Charlotte, VT (US); David L. Edwards, Poughkeepsie, NY (US); Thomas J. Fleischman, Poughkeepsie, NY (US); Michael J. Griffin, IV, Poughkeepsie, NY (US); Sushumna Iruvanti, Wappingers Falls, NY (US); David C. Long, Wappingers Falls, NY (US); Jennifer V. Muncy, Ridgefield, CT (US); Robin A. Susko, Owego, NY (US)

(73) Assignee: International Business Machines Corporation, Armonk, NY (US)

( * ) Notice: Subject to any disclaimer, the term of this patent is extended or adjusted under 35 U.S.C. 154(b) by 168 days.

(21) Appl. No.: 11/687,037

(22) Filed: Mar. 16, 2007

(65) Prior Publication Data

US 2008/0225484 A1  Sep. 18, 2008

(51) Int. Cl.
*H01L 23/34* (2006.01)
*H01L 23/495* (2006.01)
*H01L 23/48* (2006.01)

(52) U.S. Cl. .................. 257/713; 257/675; 257/688; 257/689; 257/712; 257/714; 257/715; 257/716; 257/717; 257/718; 257/719; 257/720; 257/E23.051; 257/E23.08; 257/E27.008

(58) Field of Classification Search .......... 257/688–389, 257/712–713, 675, 717–720, E23.051, E23.08, 257/E27.008, 714–716, 688–689
See application file for complete search history.

(56) References Cited

U.S. PATENT DOCUMENTS

| 4,254,431 | A | * | 3/1981 | Babuka et al. | 257/713 |
| 4,849,856 | A | * | 7/1989 | Funari et al. | 361/719 |
| 5,227,663 | A | * | 7/1993 | Patil et al. | 257/718 |
| 5,323,292 | A | | 6/1994 | Brzezinski | |
| 6,108,208 | A | * | 8/2000 | Tustaniwskyj et al. | 361/705 |

(Continued)

FOREIGN PATENT DOCUMENTS

GB    2327150 A  *  1/1999

*Primary Examiner*—Ida M Soward
(74) *Attorney, Agent, or Firm*—DeLio & Peterson, LLC; Kelly M. Nowak; Joseph Petrokaitis (57) ABSTRACT

Methods, apparatus and assemblies for enhancing heat transfer in electronic components using a flexible thermal pillow. The flexible thermal pillow has a thermally conductive material sealed between top and bottom conductive layers, with the bottom layer having a flexible reservoir residing on opposing sides of a central portion of the pillow that has a gap. The pillow may have roughened internal surfaces to increase an internal surface area within the pillow for enhanced heat dissipation. In an electronic assembly, the central portion of the pillow resides between a heat sink and heat-generating component for the thermal coupling there-between. During thermal cycling, the flexible reservoir of the pillow expands to retain thermally conductive material extruded from the gap, and then contracts to force such extruded material back into the gap. An external pressure source may contact the pillow for further forcing the extruded thermally conductive material back into the gap.

20 Claims, 5 Drawing Sheets

U.S. PATENT DOCUMENTS

| | | | |
|---|---|---|---|
| 6,313,528 B1 * | 11/2001 | Solberg | 257/723 |
| 6,333,551 B1 * | 12/2001 | Caletka et al. | 257/707 |
| 6,429,512 B1 * | 8/2002 | Huang et al. | 257/706 |
| 6,498,390 B1 * | 12/2002 | Barrow | 257/675 |
| 6,512,675 B1 * | 1/2003 | Tarter et al. | 361/714 |
| 6,521,480 B1 * | 2/2003 | Mitchell et al. | 438/108 |
| 6,665,186 B1 | 12/2003 | Calmidi et al. | |
| 6,849,935 B2 * | 2/2005 | Palanisamy | 257/678 |
| 7,063,127 B2 * | 6/2006 | Gelorme et al. | 165/80.2 |
| 7,102,226 B2 * | 9/2006 | Fitzgerald et al. | 257/712 |
| 7,259,678 B2 * | 8/2007 | Brown et al. | 340/572.8 |
| 2002/0070445 A1 * | 6/2002 | Tarter | 257/714 |
| 2003/0178174 A1 | 9/2003 | Belady et al. | |
| 2004/0194915 A1 | 10/2004 | Belady et al. | |
| 2004/0244189 A1 * | 12/2004 | White | 29/760 |
| 2007/0075118 A1 * | 4/2007 | Barina et al. | 228/44.7 |

* cited by examiner

THERMAL PILLOW

BACKGROUND OF THE INVENTION

1. Field of the Invention

The present invention relates to electronic components, and in particular, to methods and thermal assemblies for enhancing heat dissipation from electronic components.

2. Description of Related Art

Modern electronic modules include microchips and other circuit components mounted on printed circuit boards. Over the years, the speeds and power requirements of these modules have rapidly increased while the sizes thereof have shrunk. Overall, this has lead to a significant increase in power density.

During normal operating conditions, these modules generate heat or thermal energy from the microchips and other components. While some low power electronic components are able to dissipate this generated heat directly into the ambient, most require assistance to dissipate any heat that is generated during normal operating conditions.

Cooling plates or heat sinks are often used to assist high power electronic components to absorb, channel away and dissipate heat. In so doing, thermal contact is required between the heat-generating component and the cooling plate or heat sink. Since air is generally not a good thermal conductor, thermal contact is often accomplished through the use of thermally conductive materials. These materials may include, for example, thermal pastes, liquids, greases, gels, and the like. The heat sink is mechanically held to the substrate or circuit board by using bolts, adhesives, springs and the like so as to control the gap between the heat sink and the heat-generating component.

In addition to the thermal materials, retaining devices may be used, with or without the thermal materials, to maintain the thermal material between the two components. For instance, thermal pillows, o-rings, adhesives, pads, and the like, may all be used to help transfer heat between the two surfaces and/or retain the thermal material between such surfaces. However, each of these known devices brings with it the issues of stress management deficiencies, manufacturing complexity, reliability concerns and/, or high costs. Any stress management deficiencies can lead to premature device failure.

Several conventional assemblies also have rigid configurations for making the connection between the heat-generating component and the cooling plate or heat sink. However, since flexibility remains important to the mounting design to ensure constant contact while under vibration and shock induced forces, rigid configurations are often undesirable since they yield to such forces, and can potentially lead to premature device failure.

Another concern with current assemblies is that during normal operating conditions, the electronic module may undergo thermal pumping Thermal pumping occurs when the module is deformed, due to differential thermal expansions or mechanical loads, leading to extrusion of the thermal material from the gap between the cooling plate or heat sink and heat-generating component. This extruded thermal material then remains outside the gap during continued operations, leading to inefficient thermal performance, and potentially even early device failure. Little in the prior art adequately or efficiently addresses this undesirable affect of extruded thermal material during normal operating conditions.

Thus, a need continues to exist in the art for improved thermal assemblies, and methods of making such assemblies, that maximize the heat transfer rate for cooling/heating electronic modules, and in particular, those having high power flux. These methods and assemblies are preferably inexpensive, easy to assemble and/or disassemble for allowing reworkability or replacement of damaged or inoperative chips, allow for numerous electronic components to be mounted on the module or on the circuit board, and allow for flexible mounting designs to ensure constant contact between the two surfaces under vibration and shock induced forces. The methods and assemblies also provide a solution to the issue of extruded thermal material due to pumping conditions.

SUMMARY OF THE INVENTION

Bearing in mind the problems and deficiencies of the prior art, it is therefore an object of the present invention to provide a method to enhance electronic component heat dissipation, especially integrated circuit electronic components.

It is another object of the present invention to provide a thermally conductive apparatus and assembly applied to electronic components such as integrated circuits for the dissipation of heat from the component.

A further object of the invention is to provide methods and thermal assemblies for enhancing heat dissipation between components of an electronic module while having flexibility to maintain a constant contact between such components while the module endures vibration and shock induced forces.

Another object of the invention is to provide methods and thermal assemblies that are reliable, easy to manufacture, assembly and/or disassemble, allow for numerous electronic components to be mounted on the module, and are cost efficient.

It is yet another object of the invention is to provide methods and thermal assemblies that provide a solution to the problem of extruded thermal material due to thermal pumping conditions.

Still other objects and advantages of the invention will in part be obvious and will in part be apparent from the specification.

The above and other objects, which will be apparent to those skilled in the art, are achieved in the present invention, which is directed to a thermal pillow for heat dissipation. The thermal pillow includes a top layer of thermally conductive material and a bottom sheet of flexible, thermally conductive material attached to the top layer. A thermally conductive material is sealed between the top layer and the bottom sheet. The bottom sheet of the pillow also has a reservoir residing on at least opposing sides of a central portion of the thermal pillow. The reservoir retains thermally conductive material extruded from the central portion and forces this extruded thermally conductive material back into the central portion during thermal cycling.

In this aspect of the invention, the top layer of the pillow may be a surface of a heat sink, or it may be a top sheet of flexible, thermally conductive material. The bottom sheet of the pillow may have a roughened internal surface for increasing an internal surface area within the pillow, which in turn, enhances heat dissipation. This roughened internal surface may include, but is not limited to, dendrites, interleaved teeth configurations, lined-up teeth configurations, or the sheet may be crinkled to provide surface topography at least inside the pillow. Wherein the top layer of the pillow is another flexible, thermally conductive material sheet, it may also be provided with this roughened internal surface topography.

In accordance with the invention, the thermally conductive material of the present pillow may include a thermally conductive fluid, solid, and combinations thereof. The central portion of the pillow also has a gap residing between the top and bottom sheets of the pillow. Also at the central portion of the thermal pillow, the top and bottom layers of the pillow may contact each other, which is beneficial for high power flux situations. Alternatively, when high power flux is not a concern, the top and bottom layers of the pillow may have a gap in the central portion.

In another aspect, the invention is directed to an electronic module that includes a semiconductor device mounted on a substrate and a heat sink adjacent to the semiconductor device. The module also includes a thermal pillow thermally connecting the semiconductor device to the heat sink. This thermal pillow includes a top layer of thermally conductive material attached to a bottom sheet of flexible, thermally conductive material, with a thermally conductive material sealed there-between. The pillow has a central portion with a gap that resides between the semiconductor device and the heat sink. The thermally conductive material resides within this gap. The bottom sheet of the pillow also has a reservoir residing on opposite sides of the central portion. This reservoir retains thermally conductive material that is extruded from the gap and forces such extruded thermally conductive material back into the gap during thermal cycling.

In accordance with the invention, the top layer of the pillow may be a top sheet of flexible, thermally conductive material that is attached to the bottom sheet of flexible, thermally conductive material. These top and bottom sheets may have roughened internal surfaces for increasing an internal surface area within the pillow, thereby enhancing heat dissipation of the electronic module. The top and bottom sheets of the pillow may, or may not, contact each other in the central portion.

In order to enhance the thermal transfer from the semiconductor device to the heat sink, an external pressure source may contact the present pillow for further forcing the extruded thermally conductive material back into the gap. This external pressure source may be a compressor residing between the reservoirs of the bottom sheet and the substrate. The compressor contacts the reservoirs to apply a pressure thereto for forcing the extruded thermally conductive material from the reservoirs back into the gap. Alternatively, the external pressure source may be a thermal conductive injection force assembly for injecting the thermally conductive material into the pillow, and forcing the extruded thermally conductive material back into the gap.

In still another aspect, the invention is directed to methods for dissipating heat in electronic modules. In these methods, a thermal pillow is provided. The thermal pillow includes a top layer attached to a bottom sheet of flexible, thermally conductive material. The pillow includes a central portion between the top layer and bottom sheet, with a reservoir of the bottom sheet residing on opposing sides of the central portion. The central portion also has a gap that resides between the top layer and bottom sheet. A thermally conductive material is sealed within the thermal pillow, and resides within the gap as well as the reservoir of the pillow. This pillow is provided between a heat sink and a semiconductor device such that the central portion of the thermal pillow is aligned with the semiconductor device. The pillow then thermally couples the heat sink to the semiconductor device, whereby during thermal cycling the reservoir expands to retain thermally conductive material extruded from the gap, and then contracts to force such extruded thermally conductive material back into the gap. This can be accomplished by making the pillow using a spring-like material, such as, phosphor bronze, berillium copper, and the like, and form it so that the pillow is expanded by the presence of the thermally conductive material. Therefore, the pillow is constantly trying to get smaller and thereby compressing the thermally conductive material.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

In describing the preferred embodiment of the present invention, reference will be made herein to FIGS. 1A-5E of the drawings in which like numerals refer to like features of the invention.

Broadly stated, this invention comprises a thermal pillow assembly for enhancing and improving heat dissipation from an electronic module, such as, an integrated circuit ("IC") device while minimizing stresses, thermal mismatches, and costs. For convenience, the following description will be directed to semiconductors and IC's, however, it will be appreciated by those skilled in the art that the invention can be used for any type of electronic component.

Referring to the drawings, a heat sink (or thermally conducting lid) 10 is shown attached to an integrated circuit chip 15 via the thermal pillow assembly of the present invention. At an opposite side, the chip 15 is attached to a module or printed circuit board 20 using solder balls 25. The thermal pillow assembly of the invention includes a thermal pillow 30 having reservoirs on opposing sides of the chip 15, or around the chip, for retaining a thermally conductive material provided within the thermal pillow. It also preferably includes a pressure source for applying a positive pressure to the pillow for forcing extruded thermally conductive material from the reservoirs back into the gap residing between the heat sink and the chip.

In accordance with the invention, the pressure source may comprise a compressor residing under the reservoirs for applying pressure to the reservoirs during thermal cycling for resolving the issues associated with extruded thermally conductive material due to pumping conditions. Alternatively, the pressure source may be a thermal conductive injection force assembly for forcing the extruded material from the reservoirs of the pillow back into the gap. The pressure source may even be a combination of a compressor with the use of a thermal conductive injection force assembly for efficient heat transfer.

Figure 1A:
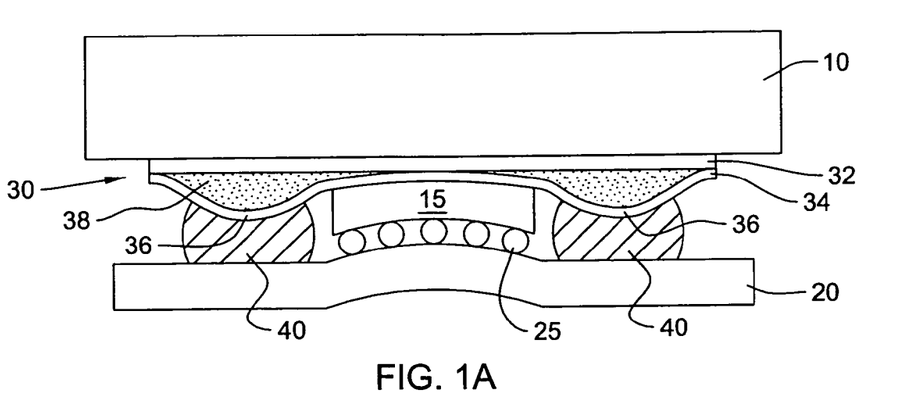
FIGS. 1A and 1B are respectively low temperature and high temperature cross sectional views of one embodiment of the thermal assembly of the invention having a double sided thermal pillow.
Figure 1B:
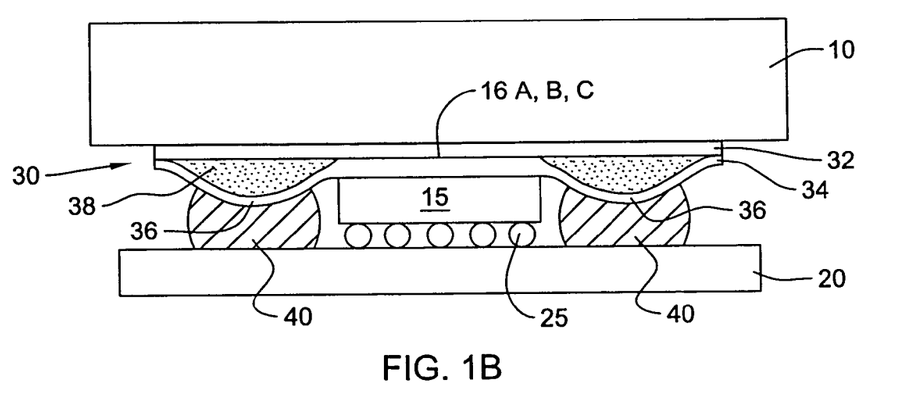
Figure 2A:
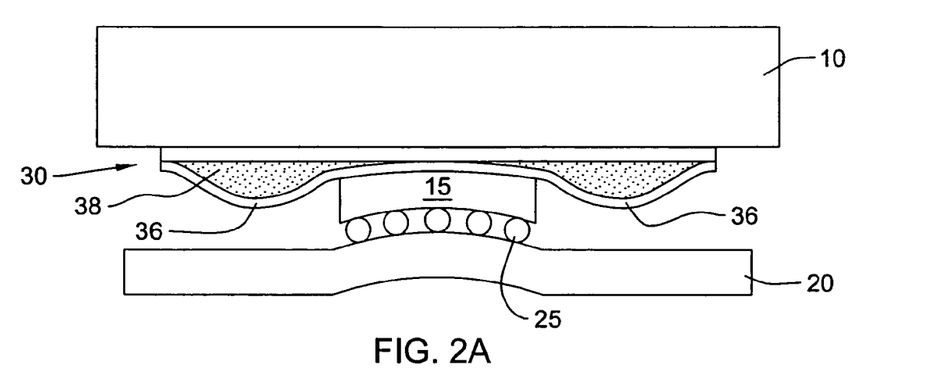
FIGS. 2A and 2B are respectively low temperature and high temperature cross sectional views of an alternate embodiments of the thermal assembly of the invention having a single sided thermal pillow.
Figure 2B:
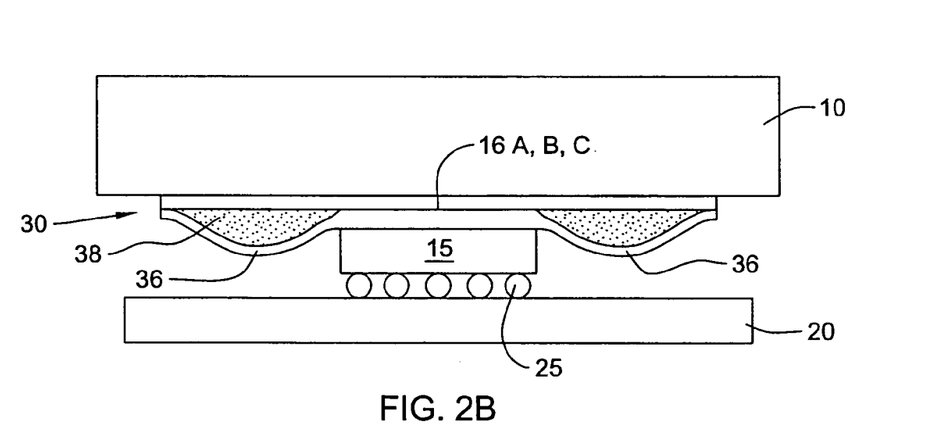

In more detail, FIGS. 1A and 1B show one embodiment of the present pillow having top and bottom foils. FIGS. 2A and 2B show an alternate embodiment of the invention with the thermal pillow having only a bottom foil and using a bottom side of the heat sink as the top of the pillow. While these embodiments are meant to illustrate and describe the present invention, it should be appreciated and understood that they are not intended to limit the invention in any way In accordance with the invention, the thermal pillow 30 may include a top foil 32 and/or a bottom foil 34, whereby the bottom foil is provided with reservoirs 36 that either surround the chip or are at least on opposing sides thereof. Each foil (i.e., top foil 32 and bottom foil 34) may have a thickness ranging from about 15 microns to about 200 microns, with the heights of the reservoir depending upon the foil thickness. For instance, in a preferred embodiment, the foils have a thickness ranging from about 25 microns to about 50 microns, with reservoirs heights ranging from about 10 microns to about 200 microns depending upon the foil thickness. If the foils are too thin, then the foils may loose strength during operating conditions, leading to breakage and product failure. Similarly, if the foils are too thick, then the required compliance and flexibility needed for proper operation of the IC will be lost, also potentially leading to breakage and product failure.

Since flexibility is critical for successful operation of the IC, the foils preferably comprise a puncture proof flexible thermally conductive material. This flexible thermally conductive material may be either a metal or a non-metal material. For instance, flexible thermal conductive metal materials may include, but are not limited to, aluminum, copper, beryllium copper, nickel plated copper, nickel, stainless steel, gold, brass, silver, phosphor-bronze, and the like. Alternatively, flexible thermal conductive non-metal materials may comprise plastics including, but not limited to, Mylar®, Kapton®, and the like. Due to the current operating conditions of modern IC devices, metal is generally a better thermal conductor as compared to plastics, and as such, is preferred for use in the thermal pillow assemblies of the invention.

Referring to FIG. 1A, the thermal pillow may include the top foil 32 in combination with the bottom foil 34 having the thermal conductor reservoirs 36. In this aspect, the thermal pillow may be a prepackaged thermal assembly ready for use in an IC. A thermally conductive material 38 is provided within the thermal pillow 30 to entirely fill the pillow. This thermally conductive material may include a conductive fluid, solid or combinations thereof. For instance, the thermal pillow may be filled with a thermally conductive liquid, liquid metal (e.g. indium, bismuth, antimony, low melting alloys, etc.), oil (e.g., PAO 100), grease, thermal paste (e.g., ATC 3.8), a thermally conductive solid material (e.g., aluminum, aluminum oxide powder, copper wool, etc.), or even combinations thereof. The thermal material may be filled by syringe under a vacuum to eliminate any undesirable air within the thermal pillow, or it may be filled followed by degassing in a vacuum to remove undesirable air from the pillow.

As shown, the thermal pillow preferably extends beyond the dimensions of the chip 15 such that, the reservoirs 36 of the bottom foil 34 surround the chip, or are at least on two opposing sides thereof. That is, the chips reside under central portions of each pillow, which correspond to locations where the thermal connection is made between the heat sink and chip, and hence, correspond to the location of the gaps therebetween. The reservoirs reside on opposing sides of each central portion, or even entirely around each central portion, for forcing thermal fluid back into the gap at such central portion. In so doing, the reservoirs may be at least a pair of areas on adjacent sides of a chip for holding thermal material, or they may even be channels surrounding each chip. The reservoirs 36 have a concave shape inside the pillow for retaining the thermally conductive material within such reservoirs, and hence within the pillow. This concave shape, in combination with the flexible, spring nature of the pillow material, assist in pumping the thermal material into the gap of the pillow at the central portion, which resides between the heat generating component and the cooling component for efficient thermal transfer.

In high power flux operations, the top foil 32 and bottom foil 34 preferably contact each other at least one location. Preferably the contact is made generally at a center of the pillow, which is preferably aligned substantially with a center of the chip. In so doing, the pillow will not have a gap (i.e. a "zero gap") at the center of the chip. This zero gap prevents any thermally conductive material from flowing between the chip and the heat sink at this location. As such, the chip is allowed to run at higher powers since the foils of the pillow make the thermal connection between the heat sink and the chip, and not the thermally conductive fill material.

It should be appreciated that the thermal foils of the pillow have a higher thermal conductivity as compared to the thermally conductive fill material within the pillow. As such, that portion of the thermal pillow having the top and bottom foils contact each other will have a higher thermal conductivity as compared to that portion of the pillow having thermally conductive material flowing between the top and bottom foils.

Figure 3A:
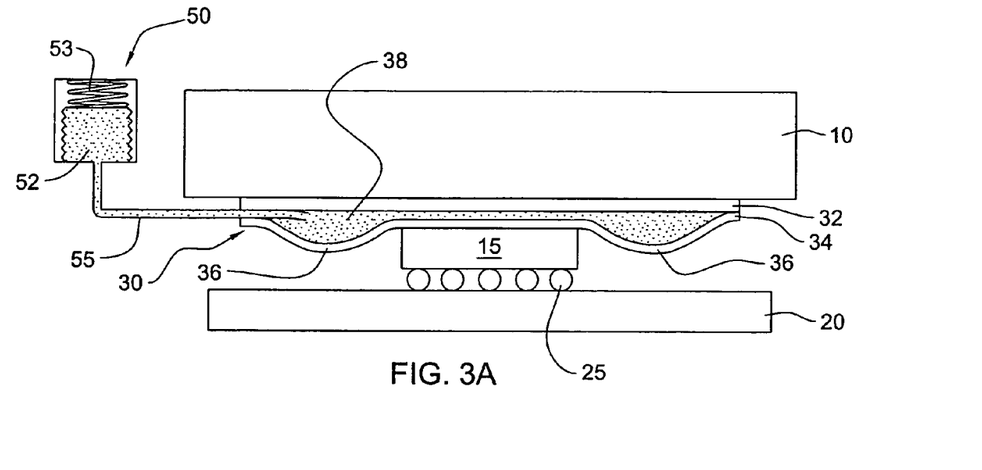
FIGS. 3A and 3B are respectively low temperature and high temperature cross sectional views of the present thermal assembly having various pressure sources for forcing extruded material into a gap between thermal components.

When a high power flux situation is not a concern, a gap may reside in the thermal pillow directly between the heat sink and the chip, as is shown in FIG. 3. In this aspect, the thermally conductive fill material within the pillow is allowed to directly flow between the heat sink and the chip. This type of configuration is often beneficial in multi-chip modules where selected chips have lower flux usages (e.g., lower power memory), and therefore requires less cooling as compared to higher-powered chips (e.g., high power processor chips).

In providing the thermal pillow 30 between the heat sink and the chip, the top foil 32 of the pillow may be pressed against and held in position against the heat sink while the bottom foil 34 presses against and is held in position against the chip, as is shown in FIGS. 1A and 1B. The use of bolts, adhesives, pressure sensitive materials, solders, and the like, and even combinations thereof, may be used to position and secure the pillow between the heat sink and chip. In a preferred embodiment, the top foil is soldered or bonded to the heat sink 10 while the bottom foil 34 of the pillow is soldered or bonded to a plated chip to further improve the thermal contact between the pillow 30 and the heat sink 10 and enhance heat dissipation.

Alternatively, as is shown in FIGS. 2A and 2B, the thermal pillow 30 may be provided between the heat sink and the chip, whereby the bottom foil 34 presses against and is held in position against the chip, while the bottom surface of the heat sink 10 is used as a top of the pillow. In this aspect, an outer perimeter of the bottom foil 34 may be securely fastened to the bottom of the heat sink, such as, by welding, adhesives, pressure sensitive materials, solders, etc., to form the present pillow. The thermally conductive fill material may then be filled by syringe under a vacuum to eliminate any undesirable air within the thermal pillow, or it may be filled followed by degassing in a vacuum to remove undesirable air from the pillow. This elimination of the top foil 32 further reduces the path length from the chip to the heat sink to enhance heat dissipation. The bottom foil 34 may be soldered to a plated chip for further improving the thermal contact between the pillow and heat sink.

Referring again to FIG. 1A, the IC is shown at a low operating temperature such as, at room temperature. At low temperatures a phenomenon known as "doming" or bending affects the chip, board and solder. However, as the IC is heated during normal operating conditions, the higher temperatures cause the chip, solder and board to all expand and become more planar, thereby significantly reducing any doming or bending conditions, as shown in FIG. 1B.

During operation, as the IC undergoes thermal cycling, the expansion and contraction of the IC components causes the thermal pillow 30 to also expand and contract, along with its reservoirs. This expansion and contraction of the reservoirs of the present pillow enables the thermally conductive fill material within the pillow to be forced in and out of the pillow gap at the central portion of the pillow, which resides between the heat sink and chip, for efficient heat dissipation of the IC device.

To further enhance heat dissipation, in accordance with the invention, a positive pressure may be applied to the pillow 30 for forcing the extruded thermal material back into the gap between the heat sink and chip. This positive pressure is preferably applied from a pressure source that is external to the pillow. The external pressure source advantageously prevents significant loss of thermally conductive material from the gap between the heat sink and chip, which is necessary for efficient heat dissipation.

In one embodiment, the pressure source for applying a positive pressure to the reservoirs may be a compressor 40. The compressor 40 preferably comprises a non-conductive material, and is positioned between the pillow and the board 20 directly under the reservoirs 36 of the bottom foil 34 to make intimate, direct contact therewith. The compressor may be attached to the board 20 and/or the pillow 30 using any known attachment means suitable for securing nonconductive components within an electronic assembly including, for example, an adhesive.

In accordance with the invention, the compressor 40 may include any device suitable for applying an upward pressure to the underside of the reservoirs 36. The upward pressure advantageously forces the thermally conductive material inside the pillow, and in particular, the extruded thermal material retained in the reservoirs 36, back into the gap residing between the heat sink and chip for efficient heat dissipation. Such a compressor may include, but is not limited to, a frame, a plurality of elastic bumpers, a number of springs, and the like, each residing under the reservoirs.

Figure 4A:
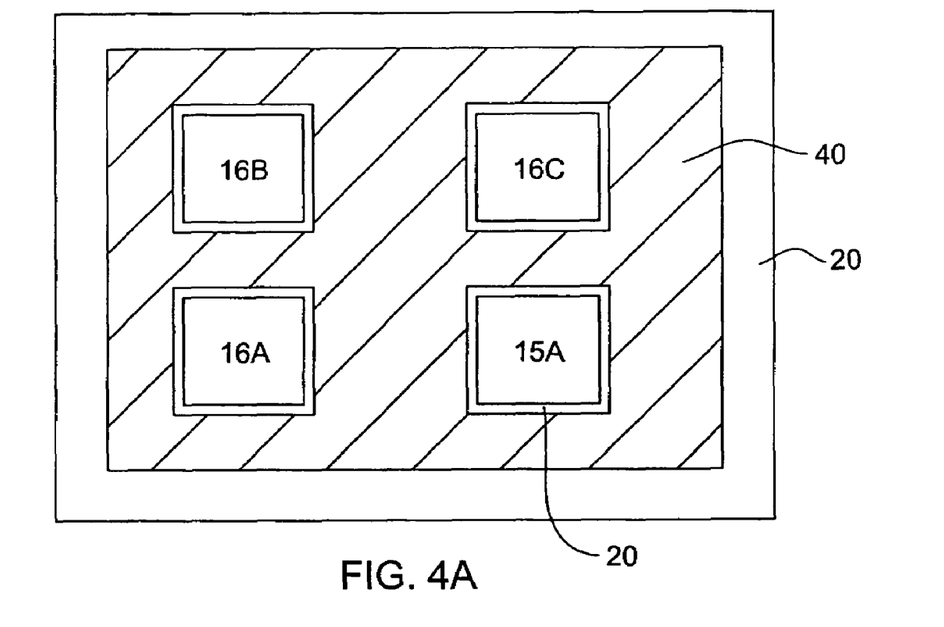
FIGS. 4A and 4B are top down views of a multi-chip module having the thermal pillow of the invention that enhances heat dissipation in the module.
Figure 4B:
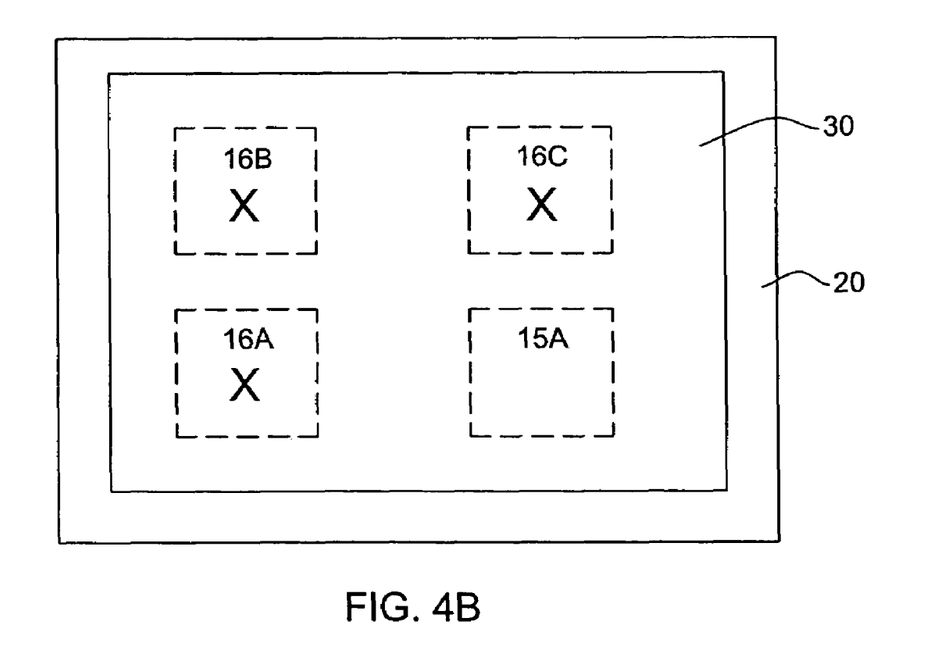

For instance, referring to FIGS. 4A and 4B, the compressor 40 may comprise a foam rubber frame having cut out portions for each chip (e.g., chips 15A and 6A-16C), especially in a multi-chip module. The foam rubber frame 40 surrounds each chip and is in contact with the underside of the reservoirs (not shown) of the pillow 30 and a top surface of the board 20 for applying an upward pressure to the reservoirs of the pillow. It should be appreciated that the compressor 40 will have dimensions to fit around the topography residing on the board. Referring to the drawings, the board having circuitry is provided and then the compressor 40 (having the corresponding cut out portions) is attached to the board (FIG. 4A). The present pillow is then placed over the compressor such that the reservoirs of the pillow are aligned and are in contact with the compressor.

As shown in FIG. 4B, the pillow may accommodate a number of chips residing on the board, such that, the reservoir is a singly connected reservoir surrounding the chips for pumping cooling/heating fluid in and out of the gap residing between the heat sink and each chip. Alternatively, the reservoirs may be a plurality of adjacent channels residing on opposing sides of each chip for pumping the fluid in and out the gap between such chip and the heat sink, and back and forth between the reservoirs. Again, when a high power flux is necessary, the top and bottom foils of the pillow may contact each other over the chip central portion, as denoted by the "X" in the dashed line chips 16A-16C residing under the pillow 30, However, when high power flux is not a concern, the pillow foils need not contact each other, as is shown in chip 15A of FIG. 4B. This can be accomplished by controlling the gap between chip 15A and heat sink, such as, by using a thinner chip at 15A or having a slight recess machined in the heat sink above chip 15A. The pillow is then attached to the heat sink (not shown) for making the necessary thermal connection.

During thermal cycling, the IC goes from low to high temperatures, and vice versa. By providing a compressor 40 directly under the reservoirs 36 of the pillow, as the pillow expands and contracts, the compressor applies a positive pressure to the reservoirs at an underside of the pillow to increase the force, rate and amount of extruded thermally conductive material that is forced back into the gap.

Figure 3B:
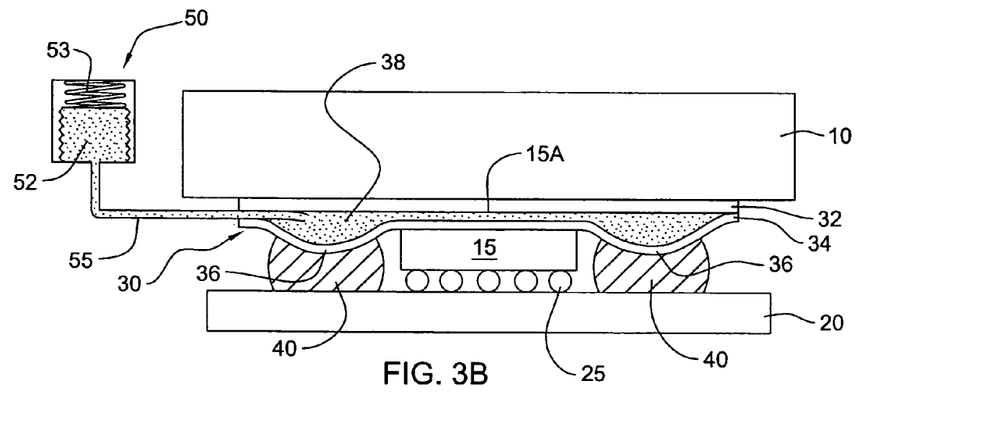

As an alternative, the positive pressure source may be a thermal conductive injection forced assembly 50. Referring to FIGS. 3A and 3B, this assembly 50 is external to the pillow 30 for enhancing the force, rate and amount of extruded thermal material that is forced back into the gap between the heat sink and chip. The thermally conductive material injection forced assembly may include a bellows 52 actuated by a spring 53 for forcing the thermally conductive material 38 into the present pillow 30 via tubing 55. The tubing 55 connects the pillow to the forced injection assembly 50. In this aspect, the thermal material is forced into the pillow forcing the extruded material back into the gap.

As the IC undergoes thermal cycling, at the higher temperatures, the thermally conductive material is forced out of the gap between the heat sink and chip toward the reservoirs 36. At the same time, the spring 53 of the forced injection assembly 50 is further compressed, the bellows 52 enlarged and thermal material fills the bellows. As the IC is subjected to lower temperatures, spring 53 presses on the bellows 52, which forces thermal material through the tube 55. This thermal material is pushed from the tube 55 into the pillow 30 at the reservoirs for assisting in forcing the extruded material held in the reservoirs back into the gap between the heat sink and chip.

As another approach to the invention, the positive pressure source may be a combination of the compressor 40 along with the thermal conductive material injection forced assembly 50 for forcing extruded material back into the gap between the heat sink and the chip, as is shown in FIG. 3B.

Figure 5A:
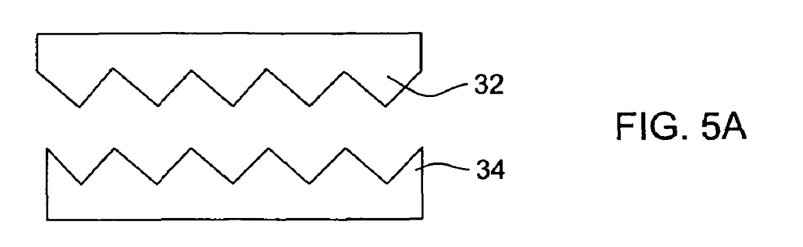
FIGS. 5A, 5B, 5C, 5D and 5E show various internal surface area configurations of the present thermal pillows for increasing the surface area thereof, and therefore, further enhancing thermal dissipation in accordance with the invention.
Figure 5B:
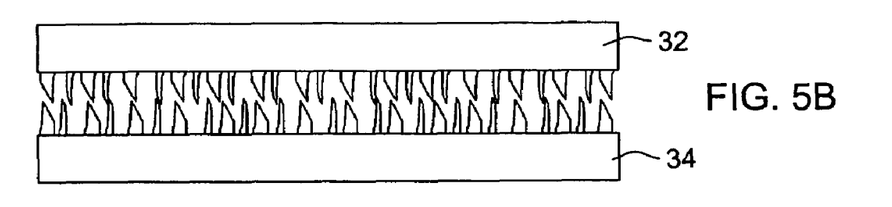
Figure 5C:
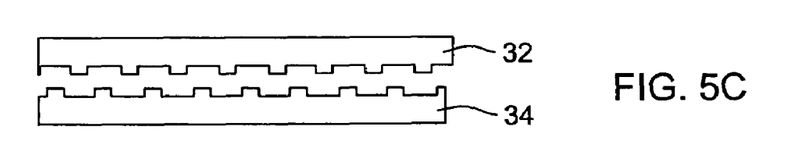
Figure 5D:
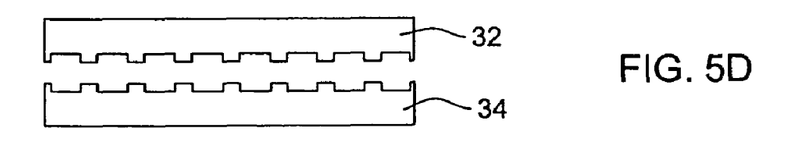
Figure 5E:
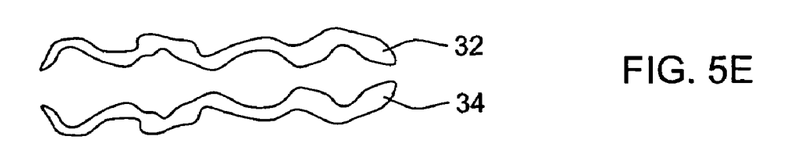

Referring to FIGS. 5A5E, the internal surfaces of the top foil 32 and/or bottom foil 34 may be provided with surface topography to further enhance the heat transfer between the heat sink and the chip. The internal surface topography provides the pillow with an increased surface area for contact with the thermally conductive fill material residing in the pillow, thereby enhancing the heat dissipation of the pillow. That is, the internal surface topography improves the thermal conductivity by increasing the surface area, in some situations it may also be beneficial to have the external surfaces of the pillow provided with such surface topography. The surface topography may be roughened surfaces including, but not limited to, jagged teeth configurations (FIG. 5A), dendrites (FIG. 5B), interleaved teeth configurations (FIG. 5C), lined-up teeth configurations (FIG. 5D), crinkled foil configurations (FIG. 5E), and the like. Dendrites are preferred since they easily interleave with each other for making contact between the top foil and the bottom foil of the pillow.

Another approach of increasing the internal surface area inside the present pillow is to provide a solid metal fill material in combination with a liquid thermally conductive material inside the pillow. Again, this increased surface area enhances heat dissipation in the instant pillow. For instance, copper wool may be provided inside the pillow along with the liquid material for filling the pillow, including the reservoirs and gap. In this aspect, once the pillow is stretched at higher temperatures the solid metal fill material contacts the both top 32 and bottom foils 34 to provide a thermal path there between. In particular, the solid metal fill will assist the top foil to contact the bottom foil, preferably at least at a center of the chip, for preventing any thermally conductive fluid fill material from flowing between the chip and heat sink at this location. Again, this will allow the chip to run at higher powers since the foils and solid metal fill with the pillow make the thermal connection between the heat sink and the chip, and not the thermally conductive fluid fill material. Alternatively, when a high power flux situation is not a concern, the solid metal fill material may act as a stand-off to prevent contact between the top and bottom foils over the chip. As such, it should be appreciated that the use of the solid metal fill material within the present pillow would be beneficial for those multi-chip modules having heat sink to chip gaps at various heights across the module.

The pillow of the present invention advantageously improves thermal conduction between the chip and heat sink (or lid), provides a flexible configuration to ensure constant contact while under vibration and shock induced forces, and solves the problems associated with extruded thermal material due to pumping conditions. By providing a solution to thermal pumping, the present pillow, with its fully encapsulated design, significantly reduces the occurrence of thermal material (e.g. pastes or oils) dry out or evaporation. The present invention also advantageously reduces any stress passed onto the chip and the effective thermal path due to the thermal material within the present pillow being pumped back into the gap between the heat sink and chip. The methods and assemblies of the invention are also relatively inexpensive and easy to assemble (or disassemble), as well as allow for numerous electronic components to be mounted on the board.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A thermal pillow for heat dissipation comprising:
   a top layer of thermally conductive material;
   a bottom sheet of flexible, thermally conductive material attached to said top layer and contacting said top layer at said central portion of said thermal pillow;
   a thermally conductive material sealed between said top layer and said bottom sheet; and
   a reservoir of said bottom sheet, residing at least on opposing sides of a central portion of said thermal pillow, that retains said thermally conductive material extruded from said central portion and forces said extruded thermally conductive material back into said central portion during thermal cycling.

2. The thermal pillow of claim 1 wherein said top layer comprises a surface of a heat sink.

3. The thermal pillow of claim 1 wherein said top layer comprises a top sheet of flexible, thermally conductive material.

4. The thermal pillow of claim 1 wherein said thermally conductive material comprises a thermally conductive fluid, solid, and combinations thereof.

5. The thermal pillow of claim 1 wherein said bottom sheet has a roughened internal surface that increases an internal surface area within said pillow for enhancing heat dissipation.

6. The thermal pillow of claim 5 wherein said roughened internal surface comprises dendrites.

7. The thermal pillow of claim 5 wherein said roughened internal surface comprises teeth configurations.

8. The thermal pillow of claim 5 wherein said roughened internal surface comprises a crinkled sheet.

9. The thermal pillow of claim 5 further including said top layer having roughened internal surfaces for increasing said internal surface area within said pillow.

10. An electronic module comprising:
    a semiconductor device mounted on a substrate;
    a heat sink adjacent to said semiconductor device; and
    a thermal pillow thermally connecting said semiconductor device to said heat sink, said thermal pillow comprising,
    a top layer of thermally conductive material;
    a bottom sheet of flexible, thermally conductive material attached to said top layer;
    a thermally conductive material sealed between said top layer and said bottom sheet;
    a central portion of said thermal pillow residing between said semiconductor device and said heat sink, said bottom sheet contacting said top layer within said central portion;
    a gap between said semiconductor device and said heat sink within said central portion, said thermally conductive material residing within said gap; and
    a reservoir of said bottom sheet, residing at least on opposing sides of said central portion, that retains said thermally conductive material extruded from said gap and forces said extruded thermally conductive material back into said gap during thermal cycling.

11. The electronic module of claim 10 wherein said top layer comprises a surface of a heat sink.

12. The electronic module of claim 10 wherein said top layer comprises a top sheet of flexible, thermally conductive material.

13. The electronic module of claim 10 wherein said bottom sheet has a roughened internal surface that increases an internal surface area within said pillow for enhancing heat dissipation.

14. The electronic module of claim 13 wherein said roughened internal surface is selected from the group consisting of dendrites, teeth configurations, and a crinkled sheet.

15. The electronic module of claim 10 wherein said top sheet has a roughened internal surface that increases an internal surface area within said pillow for enhancing heat dissipation.

16. The electronic module of claim 15 wherein said roughened internal surface is selected from the group consisting of dendrites, teeth configurations, and a crinkled sheet.

17. An electronic module comprising:
a semiconductor device mounted on a substrate;
a heat sink adjacent to said semiconductor device; and
a thermal pillow thermally connecting said semiconductor device to said heat sink, said thermal pillow comprising,
a top layer of thermally conductive material;
a bottom sheet of flexible, thermally conductive material attached to said top layer;
a thermally conductive material sealed between said top layer and said bottom sheet;
a central portion of said thermal pillow residing between said semiconductor device and said heat sink;
a gap between said semiconductor device and said heat sink within said central portion, said thermally conductive material residing within said gap;
a reservoir of said bottom sheet, residing at least on opposing sides of said central portion, that retains said thermally conductive material extruded from said gap and forces said extruded thermally conductive material back into said gap during thermal cycling; and
an external pressure source in contact with said thermal pillow for forcing said extruded thermally conductive material back into said gap, said external pressure source comprising a compressor residing between said reservoirs of said bottom sheet and said substrate, said compressor contacting said reservoirs to apply a pressure thereto for forcing said extruded thermally conductive material from said reservoirs back into said gap.

18. The electronic module of claim 17 wherein said top and bottom sheets have roughened internal surfaces for increasing an internal surface area within said pillow, thereby enhancing heat dissipation.

19. An electronic module comprising:
a semiconductor device mounted on a substrate;
a heat sink adjacent to said semiconductor device; and
a thermal pillow thermally connecting said semiconductor device to said heat sink, said thermal pillow comprising,
a top layer of thermally conductive material;
a bottom sheet of flexible, thermally conductive material attached to said top layer;
a thermally conductive material sealed between said top layer and said bottom sheet;
a central portion of said thermal pillow residing between said semiconductor device and said heat sink;
a gap between said semiconductor device and said heat sink within said central portion, said thermally conductive material residing within said gap; and
a reservoir of said bottom sheet, residing at least on opposing sides of said central portion, that retains said thermally conductive material extruded from said gap and forces said extruded thermally conductive material back into said gap during thermal cycling; and
an external pressure source in contact with said thermal pillow for forcing said extruded thermally conductive material back into said gap, said external pressure source comprising a thermal conductive injection force assembly for injecting said thermally conductive material into said pillow and forcing said extruded thermally conductive material back into said gap.

20. The electronic module of claim 19 wherein said top and bottom sheets have roughened internal surfaces for increasing an internal surface area within said pillow, thereby enhancing heat dissipation.

* * * * *